(12) United States Patent
Chiba

(10) Patent No.: US 6,224,248 B1
(45) Date of Patent: May 1, 2001

(54) LIGHT-SOURCE DEVICE AND EXPOSURE APPARATUS

(75) Inventor: Yuji Chiba, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/310,586

(22) Filed: May 12, 1999

(30) Foreign Application Priority Data

May 15, 1998 (JP) .................................................. 10-152004

(51) Int. Cl.[7] ....................................................... F21V 8/00
(52) U.S. Cl. ............................................ 362/580; 362/373
(58) Field of Search ................................... 362/373, 268, 362/562, 580

(56) References Cited

U.S. PATENT DOCUMENTS

| | | | |
|---|---|---|---|
| 4,945,457 | * 7/1990 | Yazdani et al. ................... | 362/580 X |
| 5,791,767 | * 8/1998 | Inoue et al. .......................... | 362/268 |
| 5,934,780 | * 8/1999 | Tanaka .............................. | 362/268 X |
| 5,961,203 | * 10/1999 | Schuda ............................. | 362/580 X |
| 5,967,653 | * 10/1999 | Miller et al. ......................... | 362/580 |
| 6,027,237 | * 2/2000 | Riser et al. ........................... | 362/580 |

FOREIGN PATENT DOCUMENTS

| | | |
|---|---|---|
| 7-74077 | 3/1995 | (JP) . |
| 9-106076 | 4/1997 | (JP) . |

* cited by examiner

Primary Examiner—Laura K. Tso
(74) Attorney, Agent, or Firm—Fitzpatrick, Cella, Harper & Scinto

(57) ABSTRACT

A light-source device can efficiently cool a light source without frequently exchanging an impurity removing filter. The light-source device includes a housing having an outer wall and an inner wall. A portion within the inner wall of the housing is substantially hermetically sealed with respect to a space formed by the outer wall and the inner wall. The device also includes a light source disposed within the inner wall, and an optical member. The light source guides light supplied from the light source to a portion outside of the housing. The device further includes a cooling unit for causing a fluid to flow between the outer wall and the inner wall of the housing to cool the light source.

18 Claims, 5 Drawing Sheets

LIGHT-SOURCE DEVICE AND EXPOSURE APPARATUS

BACKGROUND OF THE INVENTION

1. Field of the Invention

The present invention relates to a light-source device and an exposure apparatus. More particularly, the invention is suitably used when manufacturing semiconductor devices, such as DRAMs (dynamic random access memories), LSIs (large-scale integrated circuits) and the like.

2. Description of the Related Art

As semiconductor chips become finer, various light sources, such as high-pressure mercury lamps, KrF excimer lasers and the like, are being used as light sources for reduction-projection-type semiconductor exposure apparatuses. Particularly, in order to improve the throughput in apparatuses having a large angle of view, high-pressure mercury lamps having a higher output have become used as light sources for semiconductor exposure apparatuses using high-pressure mercury lamps. Since most of the electrical power supplied to a light source is converted into thermal energy, the temperature of a high-pressure, high-power mercury lamp becomes very high. Accordingly, in exposure apparatuses, forced air cooling is performed in order to cool a portion of the apparatus that includes a high-pressure mercury lamp, a reflecting-mirror lamp device and a power supply.

Furthermore, in a portion surrounding the lamp device and in an optical path of the exposure light, a very small amount of inorganic gases in the atmosphere reacts with the exposure light to produce a substance that adheres to optical components in the optical path, thereby reducing the transmittance of the optical components and degrading the accuracy during exposure. Accordingly, clean air, which is not chemically contaminated, is required for use as cooling air to cool the lamp device (i.e., the light-source device).

In general, the results of analyzing substances adhering to the optical components indicate that photoreactive substances in the atmosphere of the apparatus comprise NH, SO, silicon compounds (e.g., siloxane), and the like.

These impurity gases slightly remain on the surface of metallic materials during surface treatment, and are contained in the air entering from surrounding portions. It is estimated that, in accordance with a decrease in the wavelength of the exposure light and an increase in the intensity of the exposure light, degradation in the accuracy of the exposure due to the above-described photochemical reaction will be more pronounced.

Accordingly, even if it is desired to increase the brightness (power) of an exposure light source in order to improve throughput, the throughput will become degraded with time, because the above-described impurity gases will gradually reduce the illuminance of the exposure light source.

In order to solve the above-described problem, the lamp device is cooled by blowing compressed clean air, which is used in clean room facilities where the exposure apparatus is installed, onto portions surrounding the lamp and the lamp device, or, in recent exposure apparatuses, by mounting a chemical impurity removing unit, such as a chemical filter or the like, onto the lamp device and using clean air obtained by removing impurity gases by the chemical impurity removing unit.

FIG. 7 is a schematic diagram illustrating the configuration of a semiconductor exposure apparatus disclosed in Japanese Patent Laid-Open Application (Kokai) No. 7-74077 (1995).

In FIG. 7, an exposure apparatus 30 includes a chamber 10, a lamp housing 3, an illuminating optical system 4, a projection optical system 5, a wafer stage 9, a chemical filter unit 31 and the like, and performs exposure transfer of a pattern formed on a reticle 6 onto a wafer 7. A wafer chuck 8 mounts the wafer 7.

In the exposure apparatus 30, air within a clean room where the exposure apparatus 30 is installed is introduced into the chemical filter unit 31, and is discharged to the clean room after being used for cooling the lamp housing 3.

The lamp housing 3 includes a high-pressure mercury lamp (hereinafter abbreviated as a "lamp") 2, an elliptical mirror 11 for reflecting and condensing light emitted from the lamp 2, and a relay optical system 12 for the illuminating optical system 4. The chemical filter unit 31 includes a chemical filter 33, a particle filter 34 and a blower 32, and can adsorb and catch specific chemical substances in passing air. Particularly, in semiconductor exposure apparatuses, it is necessary to filter ammonia gas and hydrogen disulfide gas. Accordingly, clean-room air is introduced into the chemical filter unit 31 by the blower 32, and the clean air passing through the chemical filter 33 and the particle filter 34 is supplied into the lamp housing 3.

The supplied clean air absorbs heat generated from the lamp 2, and is discharged from a heat exhaust port of the clean-room facilities as heat exhaust.

As described above, in conventional semiconductor exposure apparatuses, when cooling the lamp housing 3, the lamp device is cooled by either using high-purity compressed air from the clean-room facilities or a blower unit.

According to such cooling, the temperature of the lamp 2 is maintained within an appropriate temperature range, and heat transfer from the lamp 2 to the main body of the exposure apparatus 30 is prevented. The cooling heat capacity is calculated and the flow rate of cooling air to be supplied is determined so as to satisfy the above-described conditions.

When cooling a lamp by supplying chemically clean air, particularly in a high-output lamp, it is necessary to provide a sufficient amount of air so as not to adversely influence the main body of the exposure apparatus. As a result, the size of the chemical filter provided in the blowing system is increased, the life of the chemical filter is decreased, and it is necessary to frequently exchange the filter. This is not desirable from the viewpoint of the cost.

SUMMARY OF THE INVENTION

The present invention has been made in cosideration of the above-described problems.

It is an object of the present invention to provide a light-source device which can prevent degradation of a light source and a light-guiding member (e.g. degradation in transmittance due to clouding) and which allows sufficient cooling of the light source without requiring frequent exchanging of a filter, and an exposure apparatus including such a light-source device.

According to one aspect of the present invention, a light-source device includes a housing having an outer wall and an inner wall. A portion within the inner wall of the housing is substantially hermetically sealed with respect to a space formed by the outer wall and the inner wall. The device also includes a light source disposed within the inner wall, and an optical member. The optical member guides light supplied from the light source to a portion outside of the housing. The device further includes cooling means. The cooling means causes a fluid to flow between the outer wall and the inner wall of the housing to cool the light source.

According to another aspect of the present invention, an exposure apparatus includes an illuminating optical system for illuminating a reticle having a pattern formed theron by light supplied from the above-described light-source device, and a projection optical system for projecting the illuminated pattern onto a wafer.

According to still another aspect of the present invention, a device manufacturing method includes the steps of coating a resist on a wafer, performing exposure transfer of a pattern formed on a reticle onto the wafer using the above-described exposure apparatus, and developing the wafer having the pattern transferred thereto.

The foregoing and other objects, advantages and features of the present invention will become more apparent from the following detailed description of the preferred embodiments taken in conjunction with the accompanying drawings.

DETAILED DESCRIPTION OF THE PREFERRED EMBODIMENTS

First Embodiment

Figure 1:
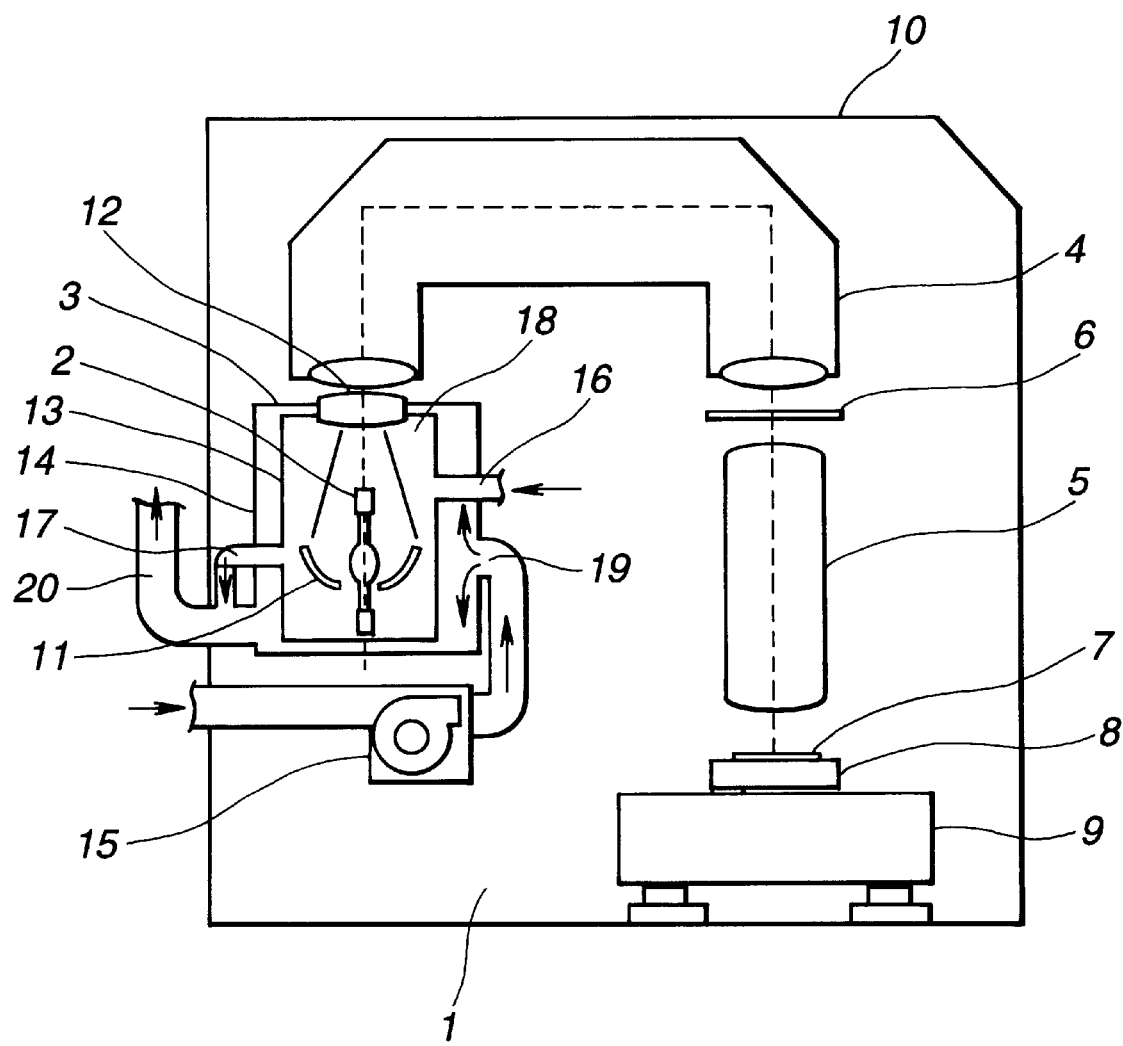
FIG. 1 is a schematic diagram illustrating the configuration of an exposure apparatus according to a first embodiment of the present invention.

A description will now be provided of a first embodiment of the present invention with reference to FIG. 1, which illustrates the first embodiment.

FIG. 1 is a schematic diagram illustrating the configuration of an exposure apparatus 1. The exposure apparatus 1 includes a high-pressure mercury lamp (hereinafter referred to as a "lamp") 2, serving as an exposure light source, a lamp house (housing) 3 accommodating the lamp 2, an illuminating optical system 4, a projection optical system 5, a reticle 6, serving as a transfer mask, a wafer 7, serving as a transfer substrate, a wafer chuck 8 for mounting the wafer 7, and a wafer stage 9. These components are accommodated within a chamber 10 which is controlled to a constant temperature and can be controlled to a very clean environment satisfying predetermined conditions relating to particles and chemicals. An i-line (having a wavelength of 365 nm) lamp having a high output of 2.5–3.5 KW is typically used as the lamp 2. Light from the lamp 2, serving as a light source, is condensed by an elliptical mirror 11, and enters the illuminating optical system 4 from the lamp housing 3 after passing through a relay lens 12 provided in the lamp housing 3 in order to perform a reduction transfer of the pattern of the reticle 6 onto the wafer 7. In the first embodiment, the lamp housing 3 has a double-wall structure comprising an inner wall 13 and an outer wall 14. A blower 15, serving as cooling means, supplies air to an air supply duct 19. This air is taken from a clean room where the exposure apparatus 1 is installed. The supplied air is discharged from an exhaust duct 20 after passing through a space between the inner wall 13 and the outer wall 14.

Figure 2:
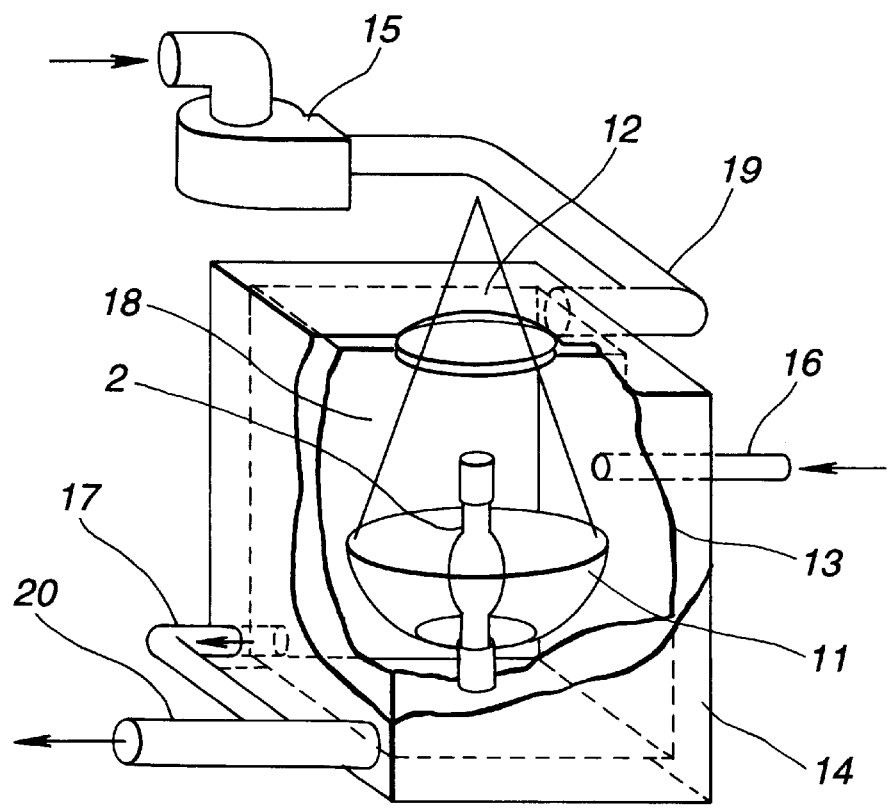
FIG. 2 is a schematic diagram illustrating the configuration of a principal portion of a lamp housing shown in FIG. 1.

FIG. 2 is a diagram illustrating details of the lamp housing 3.

The lamp 2 and the elliptical mirror 11 within the lamp housing 3 are supported on the inner wall 13. The relay lens 12 is disposed between the inner wall 13 and the outer wall 14. The inner wall 13 is preferably made of a material having excellent thermal conductivity, such as a copper alloy or the like. It is preferred to use a material having an excellent heat insulating property, such as a ceramic material or the like, for the outer wall 14 so as not to transfer heat to the main body of the exposure apparatus.

It is preferred that the inner wall 13 is supported adiabatically with respect to the outer wall 14 within an area that is as small as possible.

Air that is supplied from an air supply duct 16 via cooling means (not shown) provided within the housing (inner wall) is air having a high purity level (i.e., cleanliness) passing through a chemical filter (not shown), and is introduced into a space inside the inner wall 13 (hereinafter termed a "lamp chamber 18"). The introduced air performs primary cooling of the lamp 2 and the elliptical mirror 11, transfers heat to the inner wall 13, and is discharged from an exhaust duct 17 as heat exhaust. The air is introduced into the lamp chamber 18 in order to efficiently transfer heat generated from the lamp 2 to the inner wall 13 (primary cooling) without clouding the relay lens 12.

Instead of using compressed air, air obtained from a cooling air circulator dedicated to the lamp housing 3, or temperature-controlled air within the chamber 10 may also be used, provided that the air passes through a chemical filter and a particle filter. Furthermore, instead of using air having a high purity level, an inert gas, such as Nz or the like, may also be supplied.

The air is introduced into the space between the inner wall 13 and the outer wall 14 in order to efficiently collect heat from the inner wall 13 (secondary cooling) and to cut off heat transfer to the main body of the exposure apparatus 1, which is installed within the chamber 10, such as the reticle 6, the wafer stage 9 and the like.

At that time, the lamp chamber 18 constitutes a space that is completely hermetic with respect to the space between the inner wall 13 and the outer wall 14, except for the air supply duct 16 and the exhaust duct 17, or a space that has a substantially hermetic structure by preventing entrance of external air by setting the internal pressure at a value higher than the pressure of the external atmosphere.

Accordingly, air for cooling the space between the inner wall 13 and the outer wall 14 need not be particularly clean. Therefore, the clean air may be directly supplied from the clean room or the like without passing through a filter. As a result, it is easy to provide a large capacity of air that is required for collecting heat from the inner wall 13.

It is preferred, from the viewpoint of heat transfer, that the cooling air from the air supply duct 16 provides a large flow rate at a portion surrounding the lamp 2 and at the inside of the inner wall 13, rather than providing a large overall amount of air supply.

In consideration of the distance between the lamp 2, serving as a heat generating source, and the inner wall 13, and the presence of a dead space within the lamp chamber 18, the heat transfer efficiency is improved as the volume of the lamp chamber 18 is made smaller and the area of the inner surface of the inner wall 13 is made larger.

Figure 3:
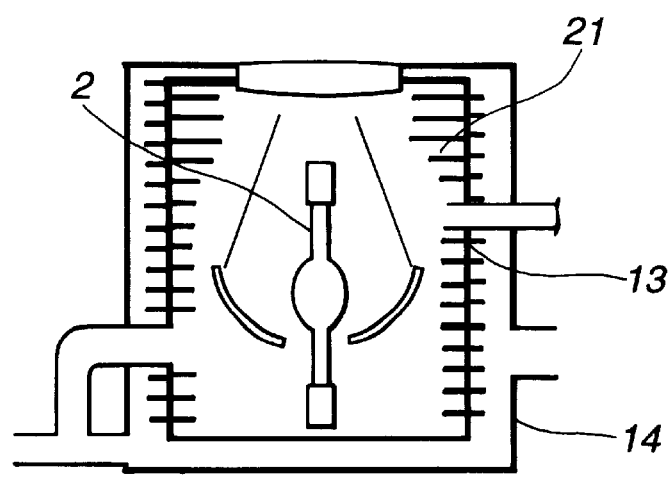
FIG. 3 is a schematic cross-sectional view illustrating a modification of the first embodiment in which radiation fins are provided in the lamp housing shown in FIG. 1.

As shown in FIG. 3, radiation fins 21 may be mounted on outer and inner surfaces of the inner wall 13 in order to improve the heat transfer efficiency. In this case, it is preferred, from the viewpoint of heat transfer, to adjust the blowing direction of the air so as to be parallel to the direction of the fins 21 (the direction of extension of the fins 21), in consideration of the direction of flow of the supplied air.

As described above, according to the first embodiment, by arranging the lamp chamber 18 to have a substantially hermetic structure by adopting a double-wall structure for the lamp housing 3, it is possible to prevent degradation of the optical members, such as the lamp 2, the elliptical mirror 11, the relay lens 12 and the like (i.e., degradation in transmittance due to clouding), and to sufficiently cool the lamp 2, even when a high-output lamp is used.

It is also possible to suppress heat transfer to the main body of the exposure apparatus 1, and to reduce the capacity of primary cooling air for directly cooling the lamp 2, by performing secondary cooling. As a result, the flow rate of air passing through the filter can be reduced even when a chemical filter is used, resulting in an increase in the life of the filter and a decrease in the cost. That is, it is possible to reduce the running cost of the exposure apparatus, and the overall cost for manufacturing semiconductor devices.

Since heat transfer between the main body of the exposure apparatus 1 and the lamp chamber 18 is substantially cut off, it is possible to reduce the temperature control load of air circulating in the chamber.

It is also possible to maintain the throughput of the apparatus for a long time, and to improve the productivity.

Second Embodiment

Figure 4:
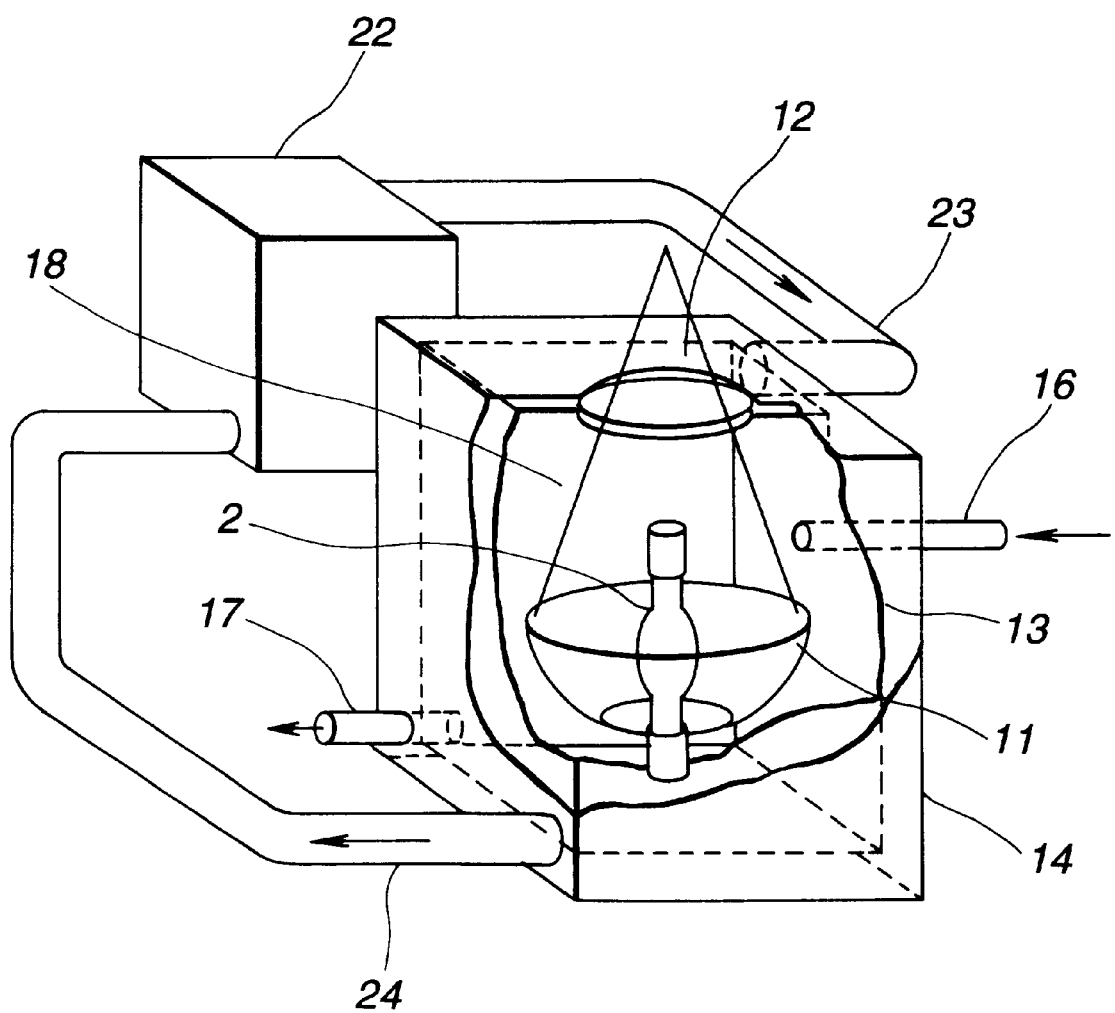
FIG. 4 is a schematic diagram illustrating the configuration of an exposure apparatus according to a second embodiment of the present invention.

FIG. 4 illustrates a second embodiment of the present invention.

In the second embodiment, the same components as those in the first embodiment are indicated by the same reference numerals, and a further description thereof will be omitted.

In the second embodiment, a liquid (e.g., water) is used instead of air as a secondary cooling medium for cooling the space between the inner wall 13 and the outer wall 14.

Since the double-wall structure of the lamp housing 3 does not require chemically pure air or an inert gas as the external secondary cooling medium, a liquid having a large heat capacity can be selected as the cooling medium.

Cooling water maintained at a constant temperature from a constant-temperature circulating-water device 22 is guided to the space between the inner wall 13 and the outer wall 14, and returns from a drain duct 24 to the constant-temperature circulating-water device 22.

According to the second embodiment, a liquid having a very high heat capacity and a substantially constant temperature is present between the lamp chamber 18 and the main body of the exposure apparatus 1. Hence, even if the temperature of primary cooling air introduced into the lamp chamber 18 is set to a relatively low temperature, the main body of the apparatus is little influenced thermally.

Accordingly, by using low-temperature air or an inert gas as the primary cooling medium for the lamp chamber 18, the flow rate of the consumed primary cooling medium can be further reduced.

Since clean-room air is not supplied as the secondary cooling medium for the space between the inner wall 13 and the outer wall 14, the clean-room environment is maintained in excellent conditions, and, for example, it is possible to reduce the amount of consumed air and the temperature-control load, and to reduce the operating cost of the clean room.

According to the above-described first and second embodiments, it is possible to provide a light-source device in which degradation of a light source and light guiding means (e.g., degradation in transmittance due to clouding) is prevented and which provides sufficient cooling of the light source, and an exposure apparatus including such a light-source device.

According to the first and second embodiments, the following effects are obtained.

(1) Since the inner wall is substantially maintained hermetically sealed with respect to the space between the outer wall and the inner wall, the cooling medium is not directly related to degradation of the light source and the light guiding members. Hence, any cooling medium may be used, and expensive members, such as a filter and the like, may be omitted.

(2) In an apparatus that includes means for cooling the inside of the inner wall of the housing, the influence of heat transfer on the outside of the housing need not be considered. Therefore, the load of the cooling means can be reduced. Accordingly, the amount of use of a filter for filtering the cooling medium of the cooling means is reduced, resulting in an increase in the life of the filter. It is also possible to provide a wide temperature setting range for the cooling medium.

(3) By using a substance that does not contain more than one of an organic silicon compound, ammonia and sulphate ions (for example, an inert gas) as the cooling medium of the cooling means, or by filtering the cooling medium using a filter that can remove at least one of an organic silicon compound, ammonia and sulphate ions, it is possible to prevent degradation in the light source and the light guiding members within the housing, such as clouding due to the adherence of impurities.

(4) When a liquid (for example, water) is used as the cooling medium, only a small amount of cooling medium is necessary for cooling, because the heat capacity of the liquid is much larger than the heat capacity of a gas, so that the size of the apparatus can be reduced. Furthermore, since it is unnecessary to take in air from outside of the apparatus as the cooling medium, the load of air conditioning equipment outside of the apparatus can be reduced.

Third Embodiment

Next, a method of manufacturing semiconductor devices utilizing the above-described exposure apparatus according to a third embodiment of the present invention will be described.

Figure 5:
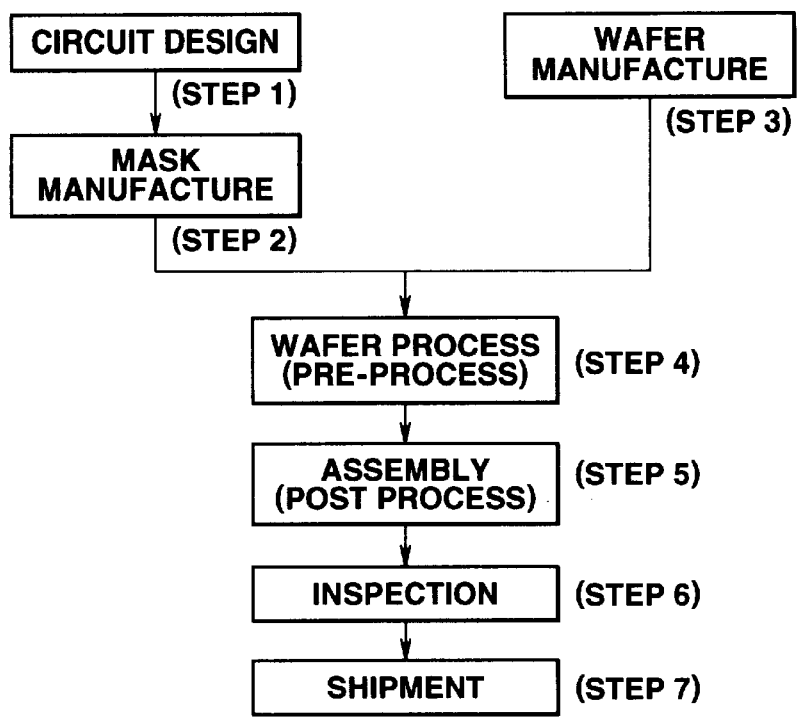
FIG. 5 is a flowchart illustrating a device manufacturing method.

FIG. 5 is a flowchart illustrating a method of manufacturing semiconductor devices (e.g., semiconductor chips of ICs (integrated circuits), LSIs, or the like, liquid-crystal panels, CCDs (charge-coupled devices) or the like).

In step 1 (circuit design), circuit design of semiconductor devices is performed. In step 2 (mask manufacture), masks, on which designed circuit patterns are formed, are manufactured.

In step 3 (wafer manufacture), wafers are manufactured using a material, such as silicon or the like. Step 4 (wafer process) is called a pre-process, in which actual circuits are formed on the wafers by means of photolithography techniques using the above-described masks and wafers.

The next step 5 (assembly) is called a postprocess which manufactures semiconductor chips using the wafers manufactured in step 4, and includes an assembling process (dicing and bonding), a packaging process (chip encapsulation), and the like.

In step 6 (inspection), inspection operations, such as operation-confirming tests, durability tests and the like, of the semiconductor devices manufactured in step 5, are performed. The manufacture of semiconductor devices is completed after passing through the above-described processes, and the manufactured devices are shipped (step 7).

Figure 6:
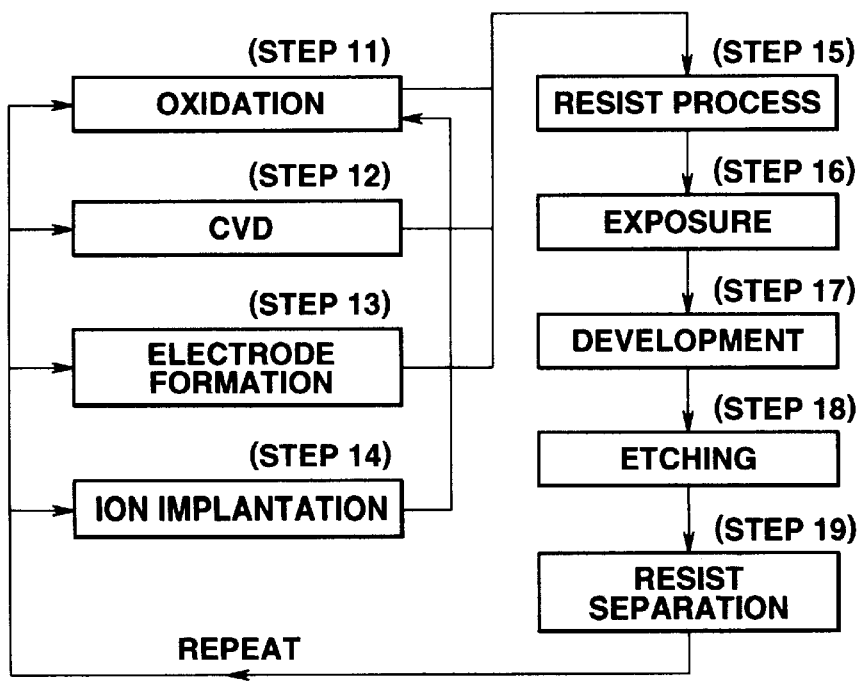
FIG. 6 is a flowchart illustrating a wafer process in the device manufacturing method shown in FIG. 5.
Figure 7:
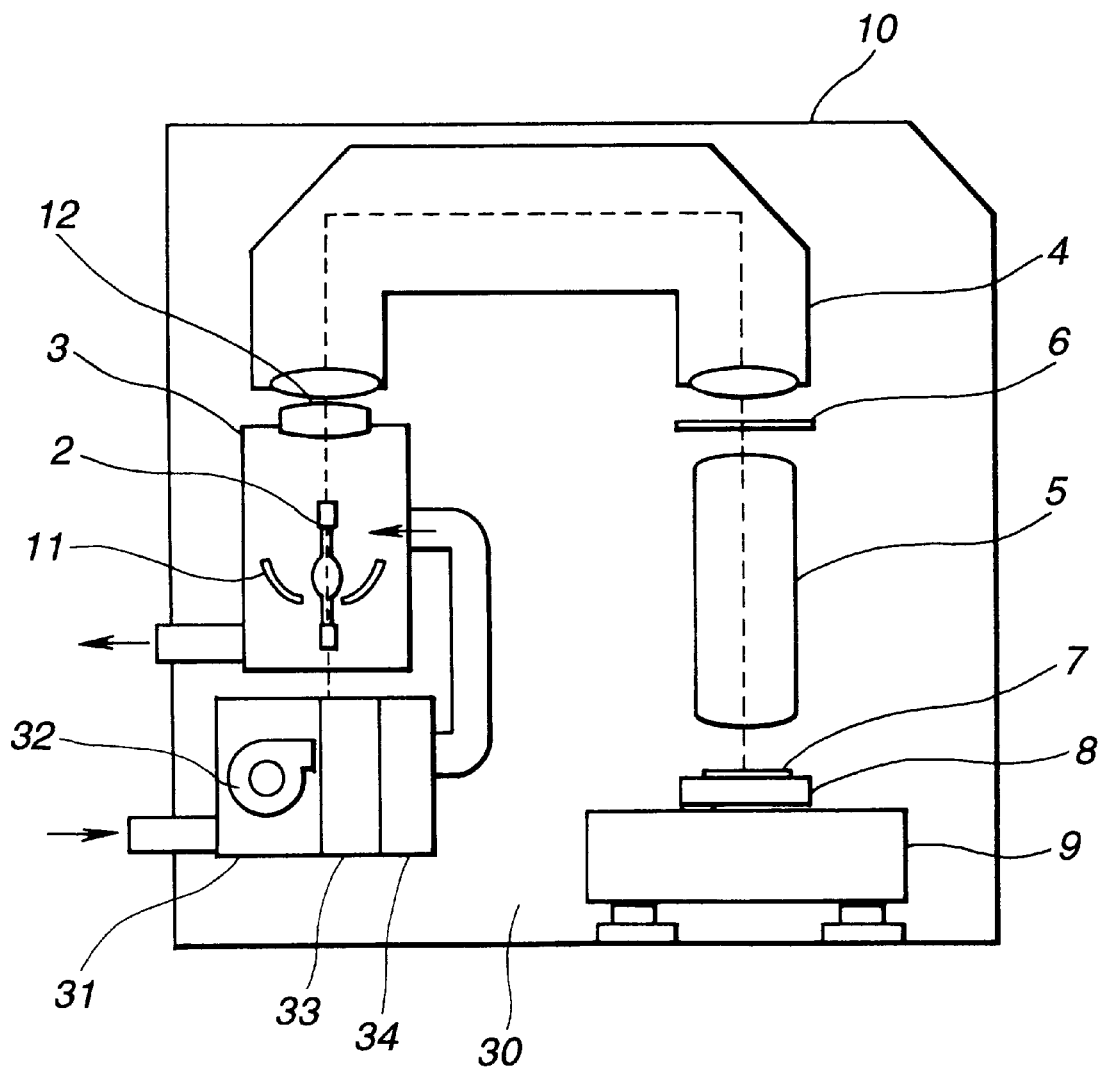
FIG. 7 is a schematic diagram illustrating the configuration of an exposure apparatus including a conventional light-source device.

FIG. 6 is a detailed flow diagram of the above-described wafer process. In step 11 (oxidation), the surface of the wafer is oxidized. In step 12 (CVD (chemical vapor deposition)), an insulating film is formed on the surface of the wafer.

In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16 (exposure), the circuit pattern on the mask is exposed and printed onto the wafer using the above-described exposure apparatus.

In step 17 (development), the exposed wafer is developed. In step 18 (etching), portions other than the developed resist image are etched off. In step 19 (resist separation), the resist, which becomes unnecessary after the completion of the etching, is removed. By repeating these steps, a final circuit pattern made of multiple patterns is formed on the wafer.

According to the manufacturing method of the third embodiment, it is possible to easily manufacture semiconductor devices having a high integration, which have previously been difficult to manufacture.

The individual components shown in outline in the drawings are all well known in the light-source device and exposure apparatus arts and their specific construction and operation are not critical to the operation or the best mode for carrying out the invention.

While the present invention has been described with respect to what are at present considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A light-source device comprising:
    a housing having an outer wall and an inner wall, a portion within the inner wall of said housing being substantially hermetically sealed with respect to a space formed by the outer wall and the inner wall;
    a light source, disposed within the inner wall, for emitting light;
    an optical member, said optical member guiding light emitted by said light source to a portion outside of said housing; and
    cooling means for causing a fluid to flow between the outer wall and the inner wall of said housing to cool said light source.

2. A device according to claim 1, wherein a fluid contained by the inner wall is cleaner than the fluid flowing between the outer wall and the inner wall.

3. A device according to claim 2, further comprising means for cooling a space within the inner wall, said means for cooling the space within the inner wall causing the fluid to flow within the inner wall.

4. A device according to claim 1, wherein the fluid flowing between the outer wall and the inner wall comprises a liquid.

5. A device according to claim 1, wherein the inner wall is made of a material containing copper.

6. A device according to claim 1, wherein the inner wall includes fins.

7. An exposure apparatus comprising:
    a light-source device comprising (i) a housing having an outer wall and an inner wall, a portion within the inner wall of said housing being substantially hermetically sealed with respect to a space formed by the outer wall and the inner wall, (ii) a light source, disposed within the inner wall, for emitting light, (iii) an optical member for guiding light emitted by said light source to a portion outside of said housing, and (iv) cooling means for causing a fluid to flow between the outer wall and the inner wall of said housing to cool said light source;
    an illuminating optical system for illuminating a reticle having a pattern formed theron by light supplied from said light-source device; and
    a projection optical system for projecting the illuminated pattern onto a wafer.

8. An exposure apparatus according to claim 7, wherein a fluid contained by the inner wall is cleaner than the fluid flowing between the outer wall and the inner wall.

9. An exposure apparatus according to claim 8, further comprising means for cooling a space within the inner wall, said means for cooling the space within the inner wall causing the fluid to flow within the inner wall.

10. An exposure apparatus according to claim 7, wherein the fluid flowing between the outer wall and the inner wall comprises a liquid.

11. An exposure apparatus according to claim 7, wherein the inner wall is made of a material containing copper.

12. An exposure apparatus according to claim 7, wherein the inner wall includes fins.

13. A device manufacturing method comprising the steps of:
    providing a light-source device comprising (i) a housing having an outer wall and an inner wall, a portion within the inner wall of the housing being substantially hermetically sealed with respect to a space formed by the outer wall and the inner wall, (ii) a light source, disposed within the inner wall, for emitting light, (iii) an optical member for guiding light emitted by the light source to a portion outside of the housing, and (iv) cooling means for causing a fluid to flow between the outer wall and the inner wall of the housing to cool said light source;
    coating a resist on a wafer;
    illuminating a reticle having a pattern formed theron by light supplied from the light-source device;
    performing exposure transfer of a pattern formed on a reticle onto the wafer using the light-source device; and
    developing the wafer having the pattern transferred thereto.

14. A method according to claim 13, wherein a fluid contained by the inner wall is cleaner than the fluid flowing between the outer wall and the inner wall.

15. A method according to claim 14, further comprising cooling a space within the inner wall by causing the fluid to flow within the inner wall.

16. A method according to claim 13, wherein the fluid flowing between the outer wall and the inner wall comprises a liquid.

17. A method according to claim 13, wherein the inner wall is made of a material containing copper.

18. A method according to claim 13, wherein the inner wall includes fins.

* * * * *

UNITED STATES PATENT AND TRADEMARK OFFICE
CERTIFICATE OF CORRECTION

PATENT NO. : 6,224,248 B1  
DATED : May 1, 2001  
INVENTOR(S) : Yuji Chiba

Page 1 of 1

It is certified that error appears in the above-identified patent and that said Letters Patent is hereby corrected as shown below:

Column 4,  
Line 40, "Nz" should read -- $N_2$ --.

Column 8,  
Line 16, "theron" should read -- thereon --; and  
Line 47, "theron" should read -- thereon --.

Signed and Sealed this

Nineteenth Day of February, 2002

Attest:

JAMES E. ROGAN  
Attesting Officer  Director of the United States Patent and Trademark Office